United States Patent
Zhang (10) Patent No.: US 10,541,648 B2
(45) Date of Patent: Jan. 21, 2020

(54) WIDEBAND SIGNAL SOURCE

(71) Applicant: Chengdu Sicore Semiconductor Corp. Ltd., Sichuan (CN)

(72) Inventor: Cemin Zhang, Diamond Bar, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 28 days.

(21) Appl. No.: 16/015,143

(22) Filed: Jun. 21, 2018

(65) Prior Publication Data

US 2019/0348949 A1 Nov. 14, 2019

(30) Foreign Application Priority Data

May 11, 2018 (CH) .......................... 2018 1 0450379

(51) Int. Cl.
| | |
|---|---|
| *H03B 5/18* | (2006.01) |
| *H03B 5/12* | (2006.01) |
| *H03L 7/099* | (2006.01) |
| *H03L 7/18* | (2006.01) |
| *H03L 7/087* | (2006.01) |
| *H03L 7/089* | (2006.01) |
| *H03L 7/113* | (2006.01) |

(52) U.S. Cl.
CPC ......... *H03B 5/1852* (2013.01); *H03B 5/1215* (2013.01); *H03L 7/087* (2013.01); *H03L 7/0891* (2013.01); *H03L 7/099* (2013.01); *H03L 7/113* (2013.01); *H03L 7/18* (2013.01)

(58) Field of Classification Search
CPC ... H03B 5/1215; H03B 5/1852; H03L 7/0891; H03L 7/113; H03L 7/009; H03L 7/087
See application file for complete search history.

(56) References Cited

U.S. PATENT DOCUMENTS

| | | | |
|---|---|---|---|
| 8,957,738 B1 | 2/2015 | Koechlin et al. | |
| 2007/0147571 A1* | 6/2007 | Yu | H03K 21/023 377/47 |
| 2017/0005786 A1* | 1/2017 | Perdoor | H04L 7/0331 |
| 2018/0205386 A1* | 7/2018 | Kim | H03L 7/24 |

OTHER PUBLICATIONS

Analog Devices, Product No. "HMC733LC4", [online], [retrieved Aug. 2, 2018]. Retrieved from Internet: <URL: http://www.analog.com/en/products/rf-microwave/vcos-plos/vcos-with-singleoutput/hmc733.html> (7 pgs).
Analog Devices, Product No. "HMC830LP6", [online], [retrieved Aug. 2, 2018]. Retrieved from Internet: <URL: http://www.analog.com/en/products/clock-and-timing/phase-locked-loop/fractional-npll/hmc830.html#product-overview> (9 pgs).

* cited by examiner

*Primary Examiner* — Jeffrey M Shin
(74) *Attorney, Agent, or Firm* — North Weber & Baugh LLP (57) ABSTRACT

Present invention relate to a wideband signal source. The wideband signal source comprises a voltage controlled oscillator (VCO), a first buffer and a programmable frequency extender. The VCO outputs a signal with at least N:1 frequency tuning ratio, with N being an integer or a non-integer number larger than 1. The frequency extender receives the signal via the buffer to generate a final output, which has a wider frequency band than the signal. The buffer isolates the final output from interfering VCO for VCO operation stability. The frequency extender comprises at least a 1/N frequency divider, which matches the N:1 frequency tuning ratio of the signal, such that the final output has a gapless frequency band wider than the VCO output signal.

20 Claims, 5 Drawing Sheets

WIDEBAND SIGNAL SOURCE

CROSS-REFERENCE TO RELATED APPLICATIONS

This application claims foreign priority to Chinese Patent Application No. 201810450379.4, entitled "A WIDEBAND SIGNAL SOURCE", naming Cemin Zhang as inventor, and filed May 11, 2018, the subject matter of which is hereby incorporated herein by reference.

BACKGROUND

A. Technical Field

The present invention relates generally to a wideband signal source, and more particularly to a wideband signal source with reduced noise.

B. Background of the Invention

Wideband signal sources are used widely in various electronic applications. Ideally, a wideband signal source has continuous signal output covering from nearly DC to high frequencies. Furthermore, a signal source usually demands low in-band noise and spurs. Generating a wideband signal with low in-band noise can be very challenging. Various efforts have been explored for wideband signal sources. Due to in-band noises, it is very challenging to integrate a wideband VCO (especially with ≥2:1 tuning ratio) and a programmable divider into a single chip for compact packing.

Accordingly, there is a need for a method and system to generate a wideband signal source with reduced noise.

SUMMARY OF THE INVENTION

The invention relates to a method and system for generating a wideband signal source with reduced noise.

In some embodiments, this invention provides a wideband signal source comprising a voltage controlled oscillator (VCO), a first buffer and a programmable frequency extender. In embodiments, the VCO outputs a signal with a frequency range from F min to F max, with a frequency tuning ratio (defined by F max:F min) at least N:1, N being an integer number or a non-integer number larger than 1. The frequency extender receives the signal via the first buffer to generate a final output signal, which has a wider frequency band than the signal. The buffer isolates the final output signal from interfering VCO for VCO operation stability. The frequency extender comprises n (n is an integer number, n≥1) frequency dividers. Each frequency divider has a frequency division ratio 1/N matching the N:1 frequency tuning ratio of the VCO output signal, such that the final output has a gapless frequency band covering $$\left(\frac{F_{min}}{N^n}, F_{max}\right),$$

which is much wider than the frequency range of the original VCO output signal. For example, for the signal with 8-16 GHz bandwidth (2:1 frequency tuning ratio), the frequency extender is able to generate the final output with a gapless bandwidth of 1-16 GHz, by adopting three series connected ½ frequency dividers.

In some embodiments, the programmable frequency extender comprises a first amplifier A1, a second buffer, a frequency divider module, a multiplexer and a second amplifier A2, a first decoder and a second decoder. The first amplifier couples to the first buffer to generate a first output signal (OUT1). The frequency divider module couples to the first buffer via a second buffer, which functions to isolate OUT2 and output signals of the frequency divider module from interfering VCO and OUT1. The frequency divider module may comprise a plurality of frequency dividers coupled in series. Each of the frequency dividers can be enable or disenabled depending on a signal output from the second decoder. The multiplexer couples to receive outputs from the second buffer (as the base signal) and each of the plurality of frequency dividers, and generates a multiplexer output signal based on a selection among all inputs that the multiplexer receives. The selection process may be determined by an output signal of the first decoder. The first decoder and the second decoder may receive the same input signal such that frequency dividers within frequency divider module may be controlled in collaboration with the multiplexer. The multiplexer output signal is fed into a second amplifier to generate a second output signal OUT2. The final output of the wideband signal source may be the first output signal (OUT1), the second output signal OUT2, or a combination of both.

In some embodiments, the second output signal OUT2 is fed into a frequency divider (with a frequency division ratio of 1/Ne) external to the frequency extender to generate a frequency-divided output signal. The Ne is a number larger than 1, and may or may not be the same as N. A phase frequency detector/charge pump (PFD/CP) module detects phase and frequency difference between the frequency-divided output signal and a reference clock signal, and outputs voltage or current pulse signals, which pass through a loop filter (which may be a low-pass filter) to ramp up or down a voltage signal (Vt). This voltage signal drives the VCO to increase or decrease the output frequency. Such a configuration ensures that the wideband signal source may be implemented as a wideband phase-locked signal source.

One skilled in the art will recognize that the wideband VCO may be configured in different variations. One skilled in the art will further recognize that a wideband VCO may couple to a frequency extender in various configurations, all of which may be useful in generating a wideband signal and should fall within the scope of the present invention.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Embodiment 1

Figure 1:
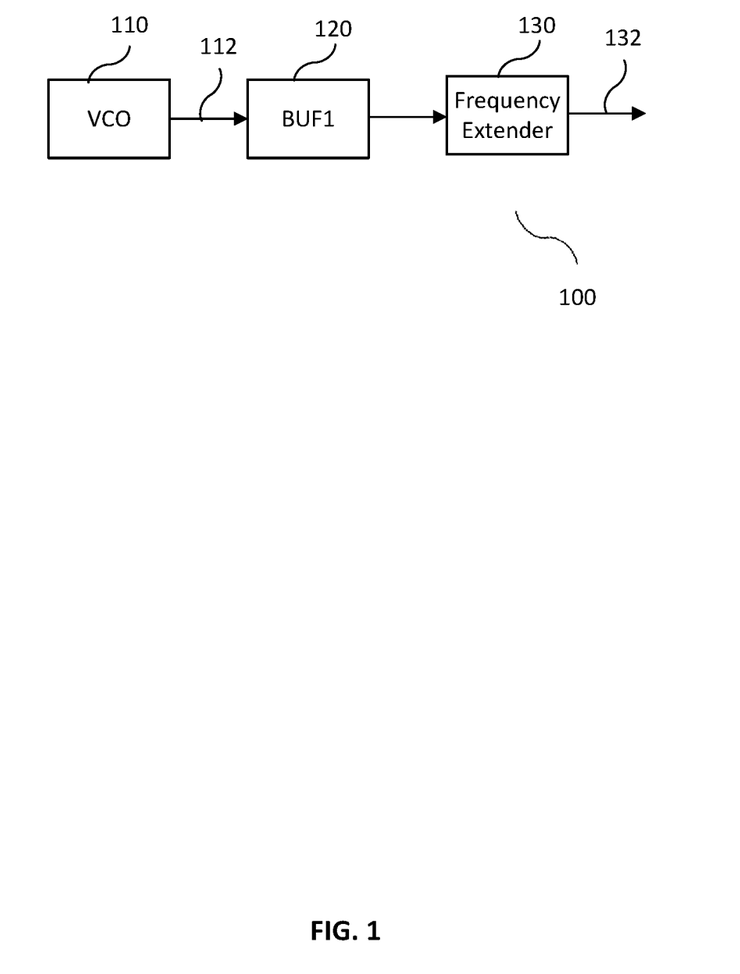
FIG. 1 is a block diagram of a wideband signal source according to a first embodiment of the invention.

FIG. 1 is a block diagram of a wideband signal source according to embodiment 1. The wideband signal source 100 comprises a voltage controlled oscillator (VCO) 110, a first buffer 120 and a programmable frequency extender 130. In embodiments, the VCO 110 is a push-push or a differential VCO outputting a signal 112 with a frequency range between a minimum frequency (F min) to a maximum frequency (F max), the frequency tuning ratio which is defined by F max:F min is at least N:1, e.g. 8-16 GHz for N=2. The signal 112 may be a differential signal or a single ended signal, differential signal is preferred since it naturally suppress even mode noises. The frequency extender 130 receives the signal 112 via the first buffer 120 to generate a final output signal 132, which has a wider frequency band than the signal 112. The first buffer 120 isolates the final output signal 132 from interfering VCO 110 for VCO operation stability. The frequency extender 130 comprises n stages (n≥1) of 1/N frequency dividers, each divider having a frequency division ratio of 1/N to match the N:1 frequency tuning ratio of the signal 112, such that the final output signal 132 has a gapless wider frequency band covering $$\left(\frac{F_{min}}{N^n}, F_{max}\right).$$

N may be an integer number or a non-integer number larger than 1. For example, for the signal 112 with 8-16 GHz bandwidth (2:1 frequency tuning ratio), the frequency extender 130 is able to generate the final output signal 132 with a gapless bandwidth of 1-16 GHz, by adopting three series connected ½ frequency dividers.

Figure 2:
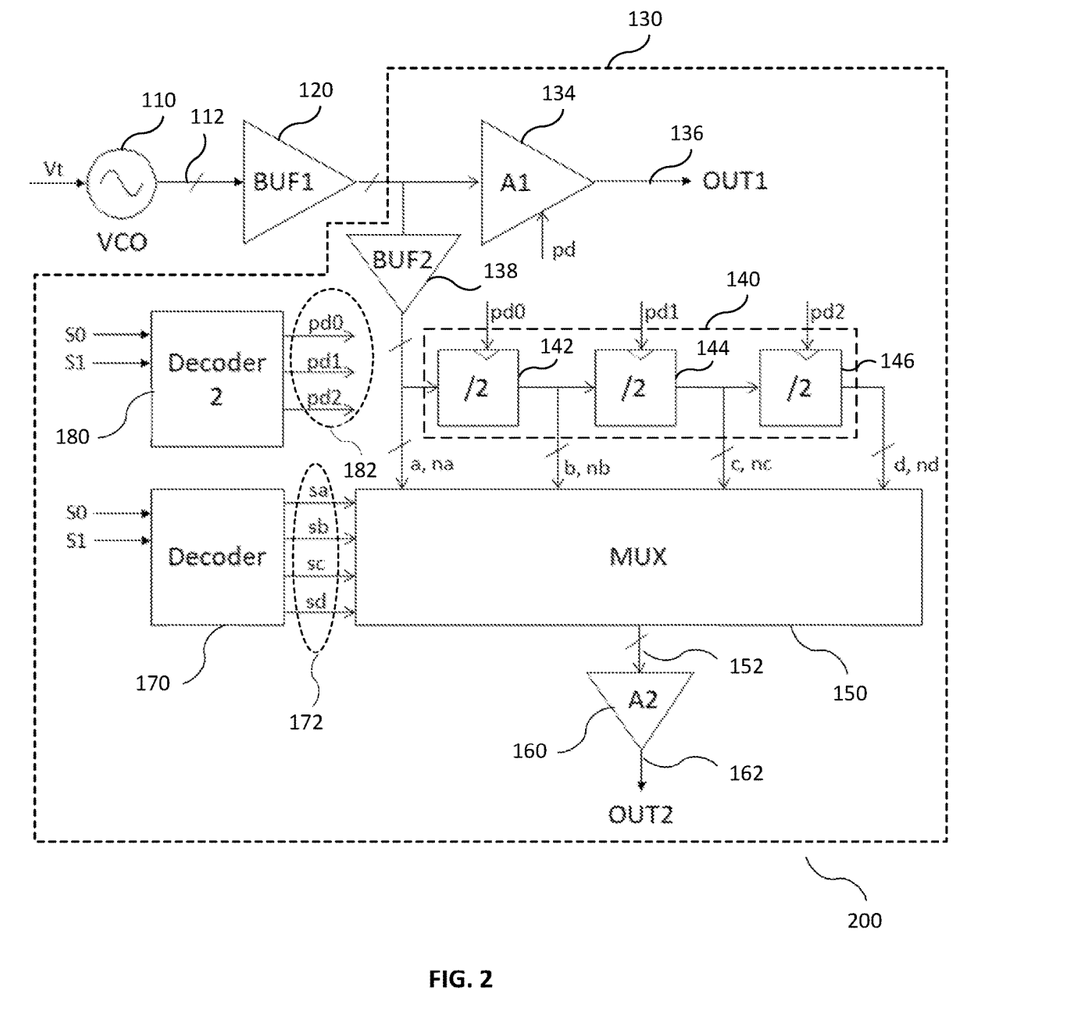
FIG. 2 is a schematic diagram of a wideband signal source according to the first embodiment of the invention.

FIG. 2 shows a schematic diagram of the wideband signal source according to embodiment 1. As shown in FIG. 2, the programmable frequency extender 130 comprises a first amplifier A1 134, a second buffer 138, a frequency divider module 140, a multiplexer 150 and a second amplifier A2 160, a first decoder 170 and a second decoder 180. The first amplifier 134 couples to the first buffer 120 to generate a first output signal (OUT1) 136. The frequency divider module 140 couples to the buffer 120 via a second buffer 138, which functions to isolate OUT2 and output signals of the frequency divider module 140 from interfering VCO and OUT1. In embodiments, the frequency divider module 140 comprises a plurality of frequency dividers (e.g. first frequency divider 142, second frequency divider 144 and a third frequency divider 146 as shown in FIG. 2) coupled in series. Each of the frequency dividers can be enable or disenabled depending on a signal output 182 from the second decoder 180, which may comprise multiple channels, such as pd0, pd1, and pd2 as shown in FIG. 2. The multiplexer 150 couples to receive outputs from the second buffer 138 (as the base signal) and each of the plurality of frequency dividers, and generates a multiplexer output signal 152 based on a selection among all inputs that the multiplexer receives. The selection process may be determined by an output signal 172 of the first decoder 170. In embodiments, the output signal 172 may comprise multiple channels, such as sa, sb, sc, sd as shown in FIG. 2. The first decoder 170 and the second decoder 180 may receive the same input signal such that frequency dividers within frequency divider module 140 may be controlled in collaboration with the multiplexer 150. The multiplexer output signal 152 is fed into a second amplifier 160 to generate a second output signal OUT2 162. One skilled in the art shall understand that the final output signal 132 may be referred as the first output signal (OUT1) 136, the second output signal (OUT2) 162, or a combination of both.

In this embodiment, the first decoder 170 is a 2-4 decoder, two input ports s0 and s1 of the 2-4 decoder are used to input logic selection signals, four output ports sa, sb, sc and sd of the 2-4 decoder couple to four logic trigger input ports of the multiplexer respectively. The second decoder 180 generates logic control signals pd0, pd1 and pd2 which control the ON or OFF states of the three frequency dividers 142, 144 and 146.

Table 1 and Table 2 are exemplary logic control truth table to implement controlling of the programmable frequency extender 130. The "/1 selected" in "OUT2 column corresponds to the situation wherein only output from the second buffer 138 (base signal, pair of a and na) is selected to generate the second output signal OUT2 162. In this selection, all the frequency dividers are disabled. The "/2 selected" in "OUT2 column corresponds to the situation wherein only output (pair of b and nb) from the first frequency divider 142 (frequency band divided by 2) is selected to generate the second output signal OUT2 162. In this selection, the frequency dividers 144 and 146 are disabled. The "/4 selected" in "OUT2 column corresponds to the situation wherein only output (pair of c and nc) from the second frequency divider 144 (frequency band divided by four) is selected to generate the second output signal OUT2 162. In this selection, the third frequency divider 146 is disabled. The "/8 selected" in "OUT2 column corresponds to the situation wherein only output (pair of d and nd) from the third frequency divider 146 (frequency band divided by eight) is selected to generate the second output signal OUT2 162. In this selection, all the frequency dividers are enabled.

Table 1 shows the logic control truth table of the present embodiment that relates input logic control signals at input ports S0, S1 to corresponding output signals at the output port OUT2:

TABLE 1

Truth table of input logic control signals at input ports S0,
S1 and the corresponding output signals at the output port OUT2

| S1 | S0 | sa | sb | sc | sd | OUT2 |
|----|----|----|----|----|----|------|
| 0  | 0  | 1  | 0  | 0  | 0  | /1 selected |
| 0  | 1  | 0  | 1  | 0  | 0  | /2 selected |
| 1  | 0  | 0  | 0  | 1  | 0  | /4 selected |
| 1  | 1  | 0  | 0  | 0  | 1  | /8 selected |

Table 2 shows the logic control truth table of the present embodiment that relates input control signals at input ports S0, S1 to the ON or OFF states of the frequency dividers:

TABLE 2

Truth table of input logic control signals at input ports S0, S1 and
the corresponding ON or OFF states of the frequency dividers

| S1 | S0 | pd0 | pd1 | pd2 | OUT2 |
|----|----|-----|-----|-----|------|
| 0  | 0  | 1   | 1   | 1   | /1 selected |
| 0  | 1  | 0   | 1   | 1   | /2 selected |
| 1  | 0  | 0   | 0   | 1   | /4 selected |
| 1  | 1  | 0   | 0   | 0   | /8 selected |

Although FIG. 2 shows that the second buffer 138 couples to the buffer 120 in series, one skilled in the art may understand that the buffers may be configured in parallel, e.g. the second buffer 138 couples to receive the VCO output signal 112 directly. Such variations are still within the scope of the invention.

In operation, when the first output signal OUT1 136 is selected as the final signal output and none sub-harmonics (/2, /4 or/8 portion) is desired, one can set the input signal (S0 & S1) to the first and second decoders as 0, so that the frequency divider 140 are disabled to ensure that no frequency-divided signals leaks into the first output signal OUT1 136. In one operation example, when the signal 112 from the VCO 120 has a bandwidth of 8-16 GHz, the wideband signal source 200 is capable of outputting a signal with a gapless bandwidth between 1~16 GHz. Such an implementation greatly enhances the robustness of the wideband signal source.

In this embodiment, the first amplifier 134 may be turned on/off though control pin pd, or through a separate $V_{CC}$ bias node. Furthermore, the first amplifier 134 may be frequency doubler such that the first output signal (OUT1) 136 has a frequency band double the band of the VCO output signal 112.

Embodiment 2

Figure 3:
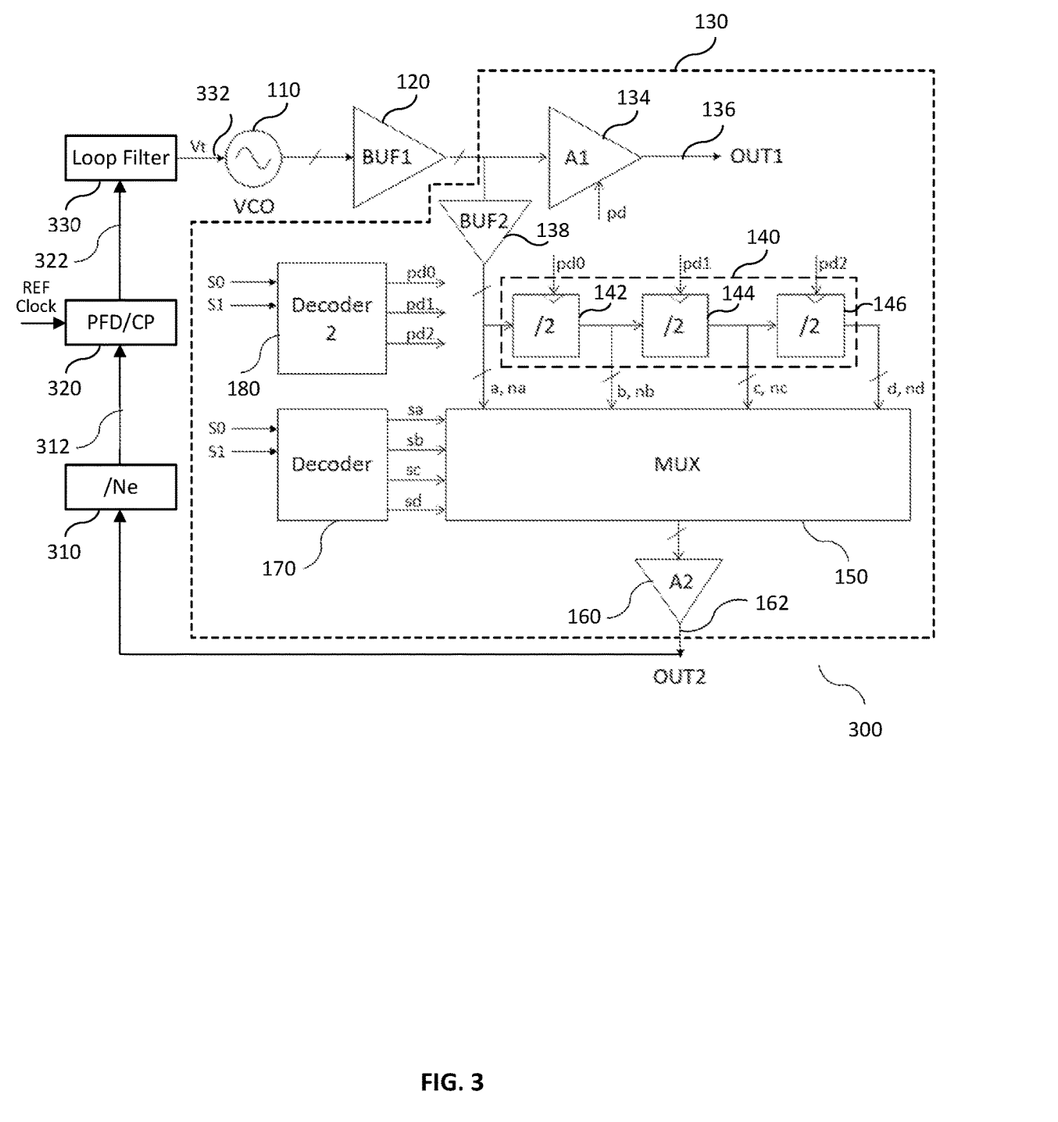
FIG. 3 is a schematic diagram of an alternative wideband signal source according to a second embodiment of the invention.

FIG. 3 is a wideband signal source 300 according to embodiment 2. In FIG. 3, the second output signal OUT2 162 is fed into a frequency divider (1/Ne) 310 external to the frequency extender to generate a frequency-divided output signal 312. The frequency divider (1/Ne) 310 may or may not have the same frequency division ratio as the frequency dividers (142, 144, 146) within the frequency divider module 140. A phase frequency detector (PFD) module 320 detects frequency and phase difference between the frequency-divided output signal 312 and a reference clock signal, and outputs voltage pulse signals 322, which pass through a loop filter 330 (which may be a low-pass filter) to ramp up or down a voltage signal (Vt) 332. In embodiments, the phase frequency detector (PFD) module 320 also comprises a charge pump (CP) to output positive and/or negative current pulses, based on detects phase difference, into the loop filter 330. This voltage signal Vt 332 drives the VCO 110 to increase or decrease the output frequency. Such a configuration ensures that the wideband signal source 300 may be implemented as a wideband phase-locked signal source.

One skilled in the art shall understand that the VCO shown in FIGS. 1-3 may be in a single states with a single Vt that archives 2:1 frequency tuning ratio, or can be a multi-band VCO with multiple states with each state covering a portion of output frequencies to achieve an overall 2:1 frequency tuning ratio.

Embodiment 3

Figure 4:
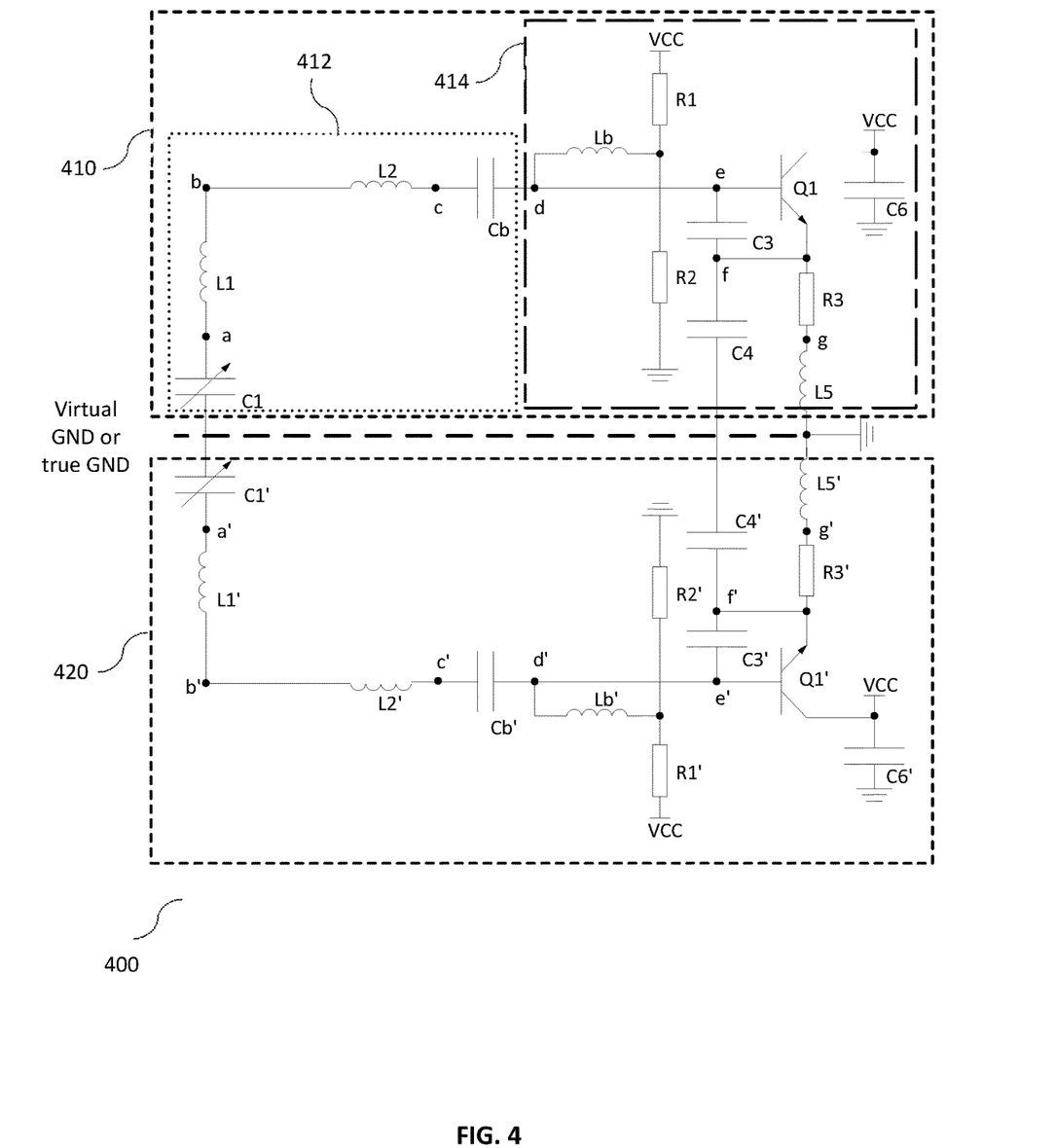
FIG. 4 is a schematic diagram of a wideband VCO for wideband signal source applications according to a third embodiment of the invention.

FIG. 4 is a schematic diagram of a wideband VCO 400 for wideband signal source applications according to the present invention. The VCO 400 may be a push-push or differential type VCO comprising two single-ended VCO 410 and 420 implemented in a balanced structure. The single-ended VCOs 410 and 420 couple in a balanced structure symmetric along a virtual ground (or true ground). As shown in FIG. 4, the single-ended VCO 410 comprises an inductor-capacitor (LC) resonator 412 and a negative resistance circuit 414. Due to the existence of internal resistance or other losses, oscillations in the resonator 412 may be damped and decay to zero. The negative resistance circuit 414 couples to the resonator 412 to cancel the positive resistance of the resonator, thus creating in effect a lossless resonator to maintain continuous oscillations occur at the resonator's resonant frequency. In one or more embodiments, the negative resistance circuit 414 comprises a NPN transistor Q1, capacitors C3 and C4, resistor R3 and inductor L5. Capacitor C4 couples between the base and the emitter of the NPN transistor Q1. The base of the NPN transistor Q1 couples to the resonator 412 via a DC block capacitor Cb to block DC bias voltage leaking from the NPN transistors Q1 into resonator 410. The collector of the NPN transistor Q1 is connected to an external power supply VCC. The emitter of the NPN transistor Q1 is grounded via resistor R3 and inductor L5. The resonator 412 couples to the base of the NPN transistor Q1. In some embodiments, the negative resistance circuit 414 may be viewed as a voltage divider comprising the NPN transistor Q1, capacitor C3, and capacitor C4. The voltage across the capacitor C3 provides a voltage feedback and inductor L5 provides a negative feedback for the NPN transistor Q1.

In one or more embodiments, the resonator 412 comprises inductor L1, inductor L2 and capacitor C1 coupled in series, at least one of which is variable such that the resonance frequency may be adjustable. In embodiments, capacitors C1 (and the capacitor C1' in the symmetric VCO 420) may be a hyperabrupt varactor to provide continuous wide frequency tuning range with, for example, greater than 2:1 frequency tuning ratio. Cb can be used as DC blocking capacitor to block the DC bias voltage for NPN from leaking into resonator. The value of Cb also affects the overall VCO resonant frequency. Capacitors Cb, C3, C4 may be implemented fixed capacitors, switchable capacitors, or any combination thereof. The frequency tuning range of the resonator 412 can be further extended if one or more of the capacitor Cb, C3, C4 are switchable capacitors with capacitance value adjustable.

Any X' and X components/nodes are symmetrical along virtual ground. For example, symmetric nodes a/a', b/b', c/c', d/d', e/e', f/f', and/or g/g' are locations that may be served as differential output(s) of VCO.

Embodiment 4

Figure 5:
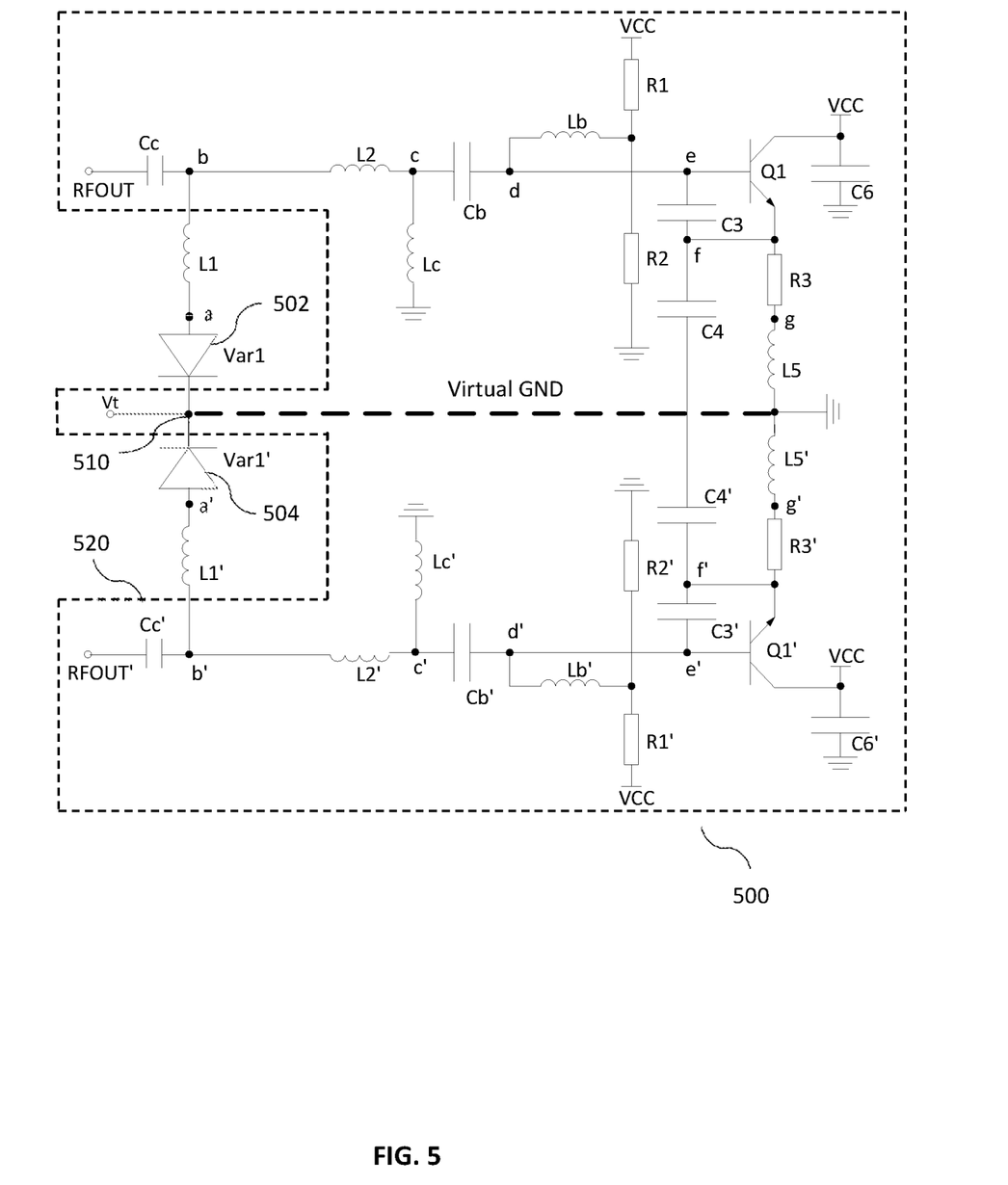
FIG. 5 is a schematic diagram of an alternative wideband VCO for wideband signal source applications according to a fourth embodiment of the invention.

FIG. 5 is a schematic diagram of an alternative wideband VCO 500 for wideband signal source applications according to the present invention. The wideband VCO 500 may be a push-push or differential VCO, similar in structure to the VCO 400 embodiment shown in FIG. 4 but with several differences. First, the VCO 500 adopts hyperabrupt varactors 502 and 504 as part of the resonators. Hyperabrupt junctions provide a C-V curve that has an inverse square law curve over at least some of the characteristic. Compared to regular abrupt varactors, hyperabrupt varactor gives much greater capacitance change for the given voltage change. Hyperabrupt varactors Var1 502 and Var1' 504 both couple to receive a control voltage Vt at a voltage control node 510 and provide continuous wide frequency tuning range with, for example, at least 2:1 frequency tuning ratio.

In some embodiments, Var1 502 and Var1' 504 may be integrated together with rest of the VCO 500 in a single chip. In some embodiments, the VCO, excluding the Var1 502 and Var1' 504 but including the voltage control node 510, is integrated into a single VCO chip (dashed block 520). In some embodiments, the Var1 502 and Var1' 504 may be discrete components with their cathode nodes attached to the voltage control node 510 of the VCO chip 520 through conductive materials such as conductive epoxy, and their anode nodes connected to the symmetric nodes b/b' of the VCO chip 520 through a pair of wirebond inductors L1/L1' with a same inductance value. Associated wirebond inductors L1/L1', the inductance value of which are related to wirebond length, may affect the overall resonant frequency. The wirebond length of wirebond inductors L1/L1' can thus be adjusted and set during a wirebonding process which helps to setup a desired output frequency range of the VCO 500. In some embodiments, the discrete varactors Var1 502 and Var1' 504 may both have their cathode nodes and anode nodes attached to the VCO chip 520 in a flip-chip style. In the embodiment shown in FIG. 5, differential signals at nodes b/b' are also served as differential outputs of the VCO 500, which are fed to the first buffer BUF1 (of FIGS. 1, 2, and 3) through DC block capacitors Cc and Cc'. In some embodiments, the VCO 500 further incorporates choke inductors Lc and Lc' to block RF signals and also function as symmetric DC grounding path for Var1 and Var1'. In embodiments, the inductors Lc and Lc' have inductance in the order of nH level, e.g., 3 nH.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A wideband signal source comprising:
   a voltage controlled oscillator (VCO) to output an output signal having a frequency range between a minimum frequency (F min) to a maximum frequency (F max) with a frequency tuning ratio, defined by F max:F min, at least N:1, N being an integer or non-integer number larger than 1;
   a buffer coupled to the VCO; and
   a frequency divider module comprising n frequency dividers coupled in series, n being an integer number greater than or equal to 1, each frequency divider has a frequency division ratio 1/N matching the N:1 frequency tuning ratio of the VCO output signal, a first frequency divider among the n frequency dividers couples to receive the output signal from the VCO via the buffer;
   a multiplexer coupled to receive output signals from each of the n frequency dividers and the output signal from the VCO via the buffer, the multiplexer outputs a multiplexer output signal based on a selection among all inputs that the multiplexer receives, the multiplexer output signal has a gapless frequency band ranging from $F\ min/N^n$ to F max.

2. The wideband signal source of claim 1 wherein the VCO is a differential or push-push type VCO comprising a resonator and a negative circuit coupled together.

3. The wideband signal source of claim 2, wherein an output signal is tapped out differentially from a pair of symmetrical locations within the VCO to feed to the frequency divider module through the buffer, the pair of symmetrical locations are symmetric along virtual ground or true ground.

4. The wideband signal source of claim 2 wherein the resonator comprises a pair of series inductor-capacitor (LC) resonators coupled symmetrically, each of the series LC based resonator comprises a hyperabrupt varactor for frequency tuning of the output signal.

5. The wideband signal source of claim 4 wherein each of the series LC based resonator further comprises at least one switchable capacitor besides the hyperabrupt varactor to achieve the N:1 frequency tuning ratio of the output signal.

6. The wideband signal source of claim 4 wherein the VCO, including the hyperabrupt varactors, is integrated in a single chip.

7. The wideband signal source of claim 4 wherein the VCO, excluding the hyperabrupt varactors, is integrated on a single chip, the hyperabrupt varactors are discrete components with cathode nodes attached to the single chip.

8. The wideband signal source of claim 1 further comprises an amplifier coupled to receive the multiplexer output signal and generates an amplified output signal.

9. The wideband signal source of claim 1 wherein the multiplexer further comprises a first decoder outputting one or more selection signals to control the selection among all inputs that the multiplexer receives.

10. A wideband signal source comprising:
    a voltage controlled oscillator (VCO) to output an output signal having a frequency range between a minimum frequency (F min) to a maximum frequency (F max)

with a frequency tuning ratio, defined by F max:F min, at least N:1, N being an integer or non-integer number larger than 1;

a first amplifier coupled to receive the output signal from the VCO via a buffer to output a first output signal;

a frequency divider module coupled to receive the output signal from the VCO, the frequency divider module comprises n frequency dividers coupled in series, n being an integer number greater than or equal to 1, each frequency divider has a frequency division ratio 1/N matching the N:1 frequency tuning ratio of the VCO output signal;

a multiplexer coupled to receive output signals from one or more of the n frequency dividers, the multiplexer outputs a multiplexer output signal based on a selection among signals that the multiplexer receives;

a second amplifier coupled to receive the multiplexer output signal and generate a second output signal;

an external frequency divider coupled to the second amplifier to receive the second output signal for generating a frequency-divided output signal;

a phase frequency detector (PFD) module coupled to the external frequency divider, the PFD detects a frequency and phase difference between the frequency-divided output signal and a reference clock signal to output voltage or current pulse signals; and a loop filter coupled to receive the pulse signals and outputs a voltage signal to drive the VCO for frequency control of the VCO output signal such that the first output signal is a phase locked signal with reference to the reference clock signal.

11. The wideband signal source of claim 1 wherein N is a number equal to 2.

12. The wideband signal source of claim 7 wherein the hyperabrupt varactors have anodes respectively connected to a pair of symmetric locations within the VCO through a pair of wirebond inductors, the inductance value of each wirebond inductor is determined by its wirebond length.

13. The wideband signal source of claim 12 wherein the wirebond lengths of the pair of wirebond inductors are identical, the wirebond lengths are set during a wirebonding process to ensure a desired VCO output frequency range.

14. The wideband signal source of claim 4 wherein the VCO, excluding the hyperabrupt varactors, is integrated on a single chip, the hyperabrupt varactors are discrete components with both of their cathode nodes and anode nodes attached to the VCO chip in a flip-chip style.

15. The wideband signal source of claim 9 further comprises a second decoder coupled to the n frequency dividers, the second decoder outputs a signal output to enable or disable each of the n frequency dividers.

16. The wideband signal source of claim 15 wherein the first decoder and the second decoder both receive an input signal such that the n frequency dividers are controlled in collaboration with the multiplexer.

17. The wideband signal source of claim 10 wherein the external frequency divider has a frequency division ratio of 1/Ne, Ne is a number larger than 1, and is the same as or different from number N.

18. The wideband signal source of claim 10 wherein the VCO is a differential or push-push type VCO, the output signal from the VCO is a differential signal tapped out from a pair of symmetrical locations within the VCO to feed to the frequency divider module through the buffer, the pair of symmetrical locations are symmetric along virtual ground or true ground.

19. The wideband signal source of claim 18 wherein the VCO comprises a pair of inductor-capacitor (LC) resonators coupled symmetrically, each of the LC based resonator comprises a hyperabrupt varactor for frequency tuning of the output signal.

20. A method for generating a wideband signal comprising:

outputting, from a voltage controlled oscillator (VCO), an output signal having a frequency range between a minimum frequency (F min) to a maximum frequency (F max) with a frequency tuning ratio, defined by F max:F min, at least N:1, N being an integer or non-integer number larger than 1, the output signal is a differential signal;

receiving, at a frequency divider module comprising n frequency dividers coupled in series, the output signal from the VCO, n being an integer number greater than or equal to 1, each frequency divider has a frequency division ratio 1/N matching the N:1 frequency tuning ratio of the VCO output signal; and receiving, at a multiplexer, all outputs from the n frequency dividers and the signal output from the VCO, the multiplexer output a multiplexer output signal based on a selection among all inputs the multiplexer receives, the multiplexer output signal has a gapless frequency band ranging from F min/N" to F max.

* * * * *